(12) United States Patent
Lee et al.

(10) Patent No.: US 8,586,464 B2
(45) Date of Patent: Nov. 19, 2013

(54) CHEMICAL MECHANICAL POLISHING SLURRY COMPOSITION FOR POLISHING PHASE-CHANGE MEMORY DEVICE AND METHOD FOR POLISHING PHASE-CHANGE MEMORY DEVICE USING THE SAME

(75) Inventors: Tae Young Lee, Gunpo-si (KR); In Kyung Lee, Euiwang-si (KR); Byoung Ho Choi, Ansan-si (KR); Yong Soon Park, Gunpo-si (KR)

(73) Assignee: Cheil Industries Inc., Gumi-si (KR)

( * ) Notice: Subject to any disclaimer, the term of this patent is extended or adjusted under 35 U.S.C. 154(b) by 1133 days.

(21) Appl. No.: 12/540,661

(22) Filed: Aug. 13, 2009

(65) Prior Publication Data

US 2009/0294749 A1    Dec. 3, 2009

Related U.S. Application Data

(62) Division of application No. 11/967,446, filed on Dec. 31, 2007, now abandoned.

(30) Foreign Application Priority Data

Jun. 29, 2007  (KR) .................. 10-2007-0065877

(51) Int. Cl.
*H01L 21/4763* (2006.01)
*H01L 21/00* (2006.01)

(52) U.S. Cl.
USPC .............. 438/592; 438/95; 438/102; 438/593

(58) Field of Classification Search
USPC .................. 438/102, 691, 692, 633, 95, 693; 257/E21.068
See application file for complete search history.

(56) References Cited

U.S. PATENT DOCUMENTS

| 3,877,938 | A | 4/1975 | Shinozaki et al. |
| 4,119,557 | A | 10/1978 | Postlethwaite |
| 4,130,454 | A | 12/1978 | Dutkewych et al. |
| 4,297,436 | A | 10/1981 | Kubotera et al. |
| 4,491,500 | A | 1/1985 | Michaud et al. |
| 4,885,106 | A | 12/1989 | Lapham et al. |
| 4,912,035 | A | 3/1990 | Belly et al. |
| 4,954,142 | A | 9/1990 | Carr et al. |
| 5,084,071 | A | 1/1992 | Nenadic et al. |
| 5,209,816 | A | 5/1993 | Yu et al. |
| 5,244,776 | A | 9/1993 | Kawai |
| 5,340,370 | A | 8/1994 | Cadien et al. |
| 5,354,490 | A | 10/1994 | Yu et al. |
| 5,407,526 | A | 4/1995 | Danielson et al. |
| 5,418,115 | A | 5/1995 | Tsubai et al. |
| 5,447,602 | A | 9/1995 | Sajbel et al. |
| 5,527,423 | A | 6/1996 | Neville et al. |
| 5,958,288 | A | 9/1999 | Mueller et al. |
| 5,972,792 | A * | 10/1999 | Hudson ................. 438/691 |
| 5,980,775 | A | 11/1999 | Grumbine et al. |
| 6,068,787 | A | 5/2000 | Grumbine et al. |
| 6,346,144 | B1 * | 2/2002 | Lee ........................... 106/3 |
| 6,930,054 | B2 * | 8/2005 | Lee et al. ............... 438/745 |
| 6,937,507 | B2 * | 8/2005 | Chen ..................... 365/163 |
| 6,953,389 | B2 | 10/2005 | Lee et al. |
| 7,166,533 | B2 * | 1/2007 | Happ ..................... 438/637 |
| 2009/0001340 | A1 | 1/2009 | Lee et al. |

FOREIGN PATENT DOCUMENTS

JP    1992-275387    9/1992

OTHER PUBLICATIONS

S. Lai et al., A 180 nm Nonvolatile Memory Cell Element Technology for Stand Alone and Embedded Applications, IEDM Technical Digest, IEEE, 2001, pp. 36.5.1-36.5.4, Santa Clara, CA.
Holleman-Wiberg., Inorganic Chemistry, Academic Press, 2001, pp. 499-502, Walter de Gruyter GmbH & Co., Berlin, Germany.
Kanamori, et al., Structure and properties of iron (III) 1,3-propanediaminetetraacetate complex in aqueous solutions, Inorganic Chimica Acta, 186, (1991) pp. 205-208, Elsevier Sequoia, Lausanne, Switzerland.
Office Action in Parent U.S. Appl. No. 11/967,446, mailed on May 13, 2009.

* cited by examiner

*Primary Examiner* — Michael Trinh
(74) *Attorney, Agent, or Firm* — Additon, Higgins, Pendleton & Ashe, P.A.

(57) ABSTRACT

A slurry composition for chemical mechanical polishing (CMP) of a phase-change memory device is provided. The slurry composition comprises deionized water and iron or an iron compound. The slurry composition can achieve high polishing rate on a phase-change memory device and improved polishing selectivity between a phase-change memory material and a polish stop layer (e.g., a silicon oxide film), can minimize the occurrence of processing imperfections (e.g., dishing and erosion), and can lower the etch rate on a phase-change memory material to provide a high-quality polished surface. Further provided is a method for polishing a phase-change memory device using the slurry composition.

16 Claims, No Drawings

US 8,586,464 B2

CHEMICAL MECHANICAL POLISHING SLURRY COMPOSITION FOR POLISHING PHASE-CHANGE MEMORY DEVICE AND METHOD FOR POLISHING PHASE-CHANGE MEMORY DEVICE USING THE SAME

CROSS-REFERENCE TO RELATED APPLICATION

This application is a divisional of U.S. application Ser. No. 11/967,446, filed Dec. 31, 2007, the entire disclosure of which is hereby incorporated by reference, which claims priority under 35 USC Section 119 from Korean Patent Application No. 10-2007-0065877, filed on Jun. 29, 2007, the entire disclosure of which is also hereby incorporated by reference.

FIELD OF THE INVENTION

The present invention relates to a slurry composition for polishing a phase-change memory device used in a semiconductor manufacturing process. More specifically, the present invention relates to a slurry composition for chemical mechanical polishing (CMP) of a metal alloy or a chalcogenide included in a phase-change memory device, and a method for polishing a phase-change memory device using the slurry composition.

BACKGROUND OF THE INVENTION

Demand for semiconductor memories has increased with expanding global markets for electronic devices, such as digital cameras, camcorders, MP3 players, digital multimedia broadcasting (DMB) receivers, navigation systems and mobile phones. In addition, there has been an increasing demand for high-capacity memories that are driven at high speed and reduced power consumption in terms of performance characteristics as compared to conventional memories. Under such circumstances, considerable research efforts have been made in developing next-generation memories that include the advantages and features inherent to dynamic random access memories (DRAMs), static random access memories (SRAMs) and flash memories. Phase-change RAMs (PRAMs), magnetoresistive RAMs (MRAMs), ferroelectric RAMs (FeRAMs) and polymer memories are currently considered next-generation memories. Of these, PRAMs possess the advantages of conventional highly integrated DRAMs, high-speed SRAMs and non-volatile NAND flash memories, and have excellent characteristics in terms of compatibility with conventional integration processes of complementary metal-oxide-semiconductor (C-MOS) field effect transistors (FETs). Based on these advantages, PRAMs have attracted more and more attention because of the greatest possibility of successful commercialization.

Since a paper reported by S. Lai (Intel) and T. Lowrey (Ovonyx) at the International Electronic Device Meeting (IEDM) in 2001, extensive research and development have been conducted on phase-change RAMs (PRAMs). Phase-change RAMs are non-volatile memories that use materials capable of inducing a reversible phase change between crystalline (low electrical resistance) and amorphous (high electrical resistance) phases due to Joule heating generated in response to an applied current or voltage to write data.

Metal alloys and chalcogenides are currently used as representative phase-change materials of PRAMs. Particularly, the composition of $Ge_xSb_yTe_z$ (GST), a chalcogenide, is now being investigated.

In CMP processes for phase-change materials of PRAM devices that are currently being developed, silicon oxide ($SiO_2$) is used to form polish stop layers.

Polishing uniformity and surface imperfections (e.g., dishing and erosion) during polishing of patterned wafers are greatly affected by some processing factors, e.g., polishing and etch rates on phase-change materials, polishing uniformity of silicon oxide films and polishing selectivity between phase-change materials and silicon oxide films.

On the other hand, slurries for polishing aluminum, copper, tungsten and other metal wires are mainly employed in semiconductor manufacturing processes. Since these metal layer materials are composed of a single element, unlike phase-change materials of PRAM devices, they induce no phase change. Therefore, the conventional metal materials cannot be used for PRAM devices and cause a significant difference in layer characteristics.

Depending on the choice of an oxidizing agent, an abrasive, and other useful additives, a CMP slurry for polishing metal wires can be tailored to provide effective polishing on metal layers at desired polishing rates while minimizing surface imperfections, defects, corrosion, and erosion. Furthermore, the polishing slurry may be used to provide controlled polishing selectivities to other thin-film materials, such as titanium, titanium nitride, tantalum, tantalum nitride, oxides and the like.

Unlike conventional metal layers composed of a single element, such as copper (Cu) or tungsten (W), layers of phase-change memory devices to be polished are composed of advanced materials consisting of particular elements, such as sulfur (S), selenium (Se), germanium (Ge), antimony (Sb), tellurium (Te), silver (Ag), indium (In), tin (Sn), gallium (Ga), and the like, in a specified ratio to undergo a reversible phase change between crystalline and amorphous phases. Since the characteristics of the materials to be polished are different from those of conventional metal layer materials, there exists a strong need to develop novel polishing compositions.

Ideal slurry compositions for polishing phase-change materials of phase-change memories (PRAMs) should meet the following requirements: i) the phase-change materials must be etched and polished at high rates; ii) the polishing selectivity between the phase-change materials and polish stop layers must be high; iii) dishing, erosion, pattern non-uniformity, imperfections (e.g., scratches, defects and corrosion), and the like, must be minimized; and iv) there must be no change in the composition and phase of elements constituting the surface of the phase-change materials after polishing.

SUMMARY OF THE INVENTION

The present invention provides a slurry composition for chemical mechanical polishing (CMP) of a phase-change memory device that can polish a phase-change memory device at a high rate, can achieve high polishing selectivity between a phase-change memory material and a polish stop layer (e.g., a silicon oxide film), and can minimize the occurrence of processing imperfections (e.g., dishing and erosion) to provide a high-quality polished surface; and a method for polishing a phase-change memory device using the CMP slurry composition.

The present invention further provides a slurry composition for chemical mechanical polishing of a phase-change memory device that can cause substantially no change in the composition or phase of a phase-change material before and after polishing, can minimize the occurrence of surface imperfections (e.g., scratches, defects, corrosion and polishing residues) to provide a clean polished surface, and includes no abrasive particles to prevent the surface of a wafer from being contaminated by abrasive particles; and a method for polishing a phase-change memory device using the CMP slurry composition.

In accordance with one aspect of the present invention, there is provided a slurry composition for chemical mechanical polishing (CMP) of a phase-change memory device which comprises deionized water and iron or an iron compound, and which does not include abrasive particles. The CMP slurry composition can include other processing aids suitable for use in a CMP process, such as but not limited to a pH adjusting agent as discussed here, so long as the composition does not include abrasive particles.

The phase-change memory device can include a metal alloy or a chalcogenide.

The phase-change memory device can include at least one compound selected from InSe, $Sb_2Te_3$, GeTe, $Ge_2Sb_2Te_5$, InSbTe, GaSeTe, $SnSb_2Te_4$, InSbGe, AgInSbTe, (GeSn)SbTe, GeSb(SeTe) and $Te_{81}Ge_{15}Sb_2S_2$.

The iron or iron compound can be metal iron or a compound containing iron in its molecular structure.

The iron or iron compound can include an ionic iron compound or an iron chelate compound.

The iron or iron compound can be present in the slurry composition of the invention in an amount of about 0.01 to about 10% by weight, based on the total weight of the slurry composition.

The slurry composition can have a pH of about 2 to about 10.

The CMP slurry composition can further comprise a pH-adjusting agent.

The pH-adjusting agent can include at least one acid selected from nitric acid, phosphoric acid, sulfuric acid, hydrochloric acid, and organic carboxylic acids having a pKa of 6 or less.

In accordance with another aspect of the present invention, there is provided a method for polishing a phase-change memory device using the CMP slurry composition.

A phase-change memory device can be fabricated by applying an insulating material to a semiconductor wafer to form an insulating layer, planarizing the insulating layer, patterning the planar insulating layer, and applying a phase-change material to the patterned insulating layer to form a phase-change material layer; and the CMP slurry composition can be brought into contact with the phase-change material layer to polish the phase-change material layer until the insulating layer is exposed.

The phase-change material layer can be polished by applying the CMP slurry composition to a rotating polishing pad and bringing the polishing pad into contact with the phase-change material layer under predetermined pressure conditions to polish portions of the phase-change material layer by a frictional force.

In yet another aspect of the present invention, there is provided a phase-change memory device polished by the polishing method.

DETAILED DESCRIPTION OF THE INVENTION

The present invention now will be described more fully hereinafter in the following detailed description of the invention, in which some, but not all embodiments of the invention are described. Indeed, this invention may be embodied in many different forms and should not be construed as limited to the embodiments set forth herein; rather, these embodiments are provided so that this disclosure will satisfy applicable legal requirements.

The present invention provides a chemical mechanical polishing (CMP) slurry composition for polishing a phase-change memory device which comprises deionized water and iron or an iron compound.

The phase-change memory device typically includes a metal alloy or a chalcogenide as a phase-change material that undergoes a reversible phase change between crystalline and amorphous phases.

Examples of suitable phase-change materials for use in the present invention include, but are not limited to: binary compounds, such as InSe, $Sb_2Te_3$ and GeTe; ternary compounds, such as $Ge_2Sb_2Te_5$, InSbTe, GaSeTe, $SnSb_2Te_4$ and InSbGe; and quaternary compounds, such as AgInSbTe, (GeSn)SbTe, GeSb(SeTe) and $Te_{81}Ge_{15}Sb_2S_2$.

The iron or iron compound is an oxidizing agent that can oxidize the surface layer of the phase-change material to an oxide or ions to facilitate the removal of the surface layer and functions to uniformly polish portions of the phase-change material within a pattern region until a polish stop layer (e.g., a silicon oxide film) is exposed to improve the surface roughness of the pattern. In addition, the use of the iron or iron compound can facilitate the removal of residues of the phase-change material present in the polish stop layer, thereby enabling more uniform polishing.

The iron or iron compound may be metal iron or a compound containing iron in its molecular structure. The iron or iron compound may also be combined with one or more other iron compounds.

As the iron compound, there may be mentioned, for example, an ionic iron compound or an iron chelate compound. The use of the ionic iron compound or iron chelate compound can be advantageous in that the phase-change material can be polished at a high rate.

The iron or iron compound may be present in the slurry composition of the invention in an amount of about 0.01 to about 10% by weight, for example about 0.05 to about 5% by weight, and as another example about 0.1 to about 2% by weight, based on the total weight of the slurry composition. An amount of the iron or iron compound within these ranges can be useful to maintain optimal etching of the phase-change material.

The pH of the slurry composition can be adjusted to about 2 to about 10, for example about 2 to about 9, and as another example about 2 to about 5. The slurry composition of the present invention can further comprise a pH-adjusting agent to adjust the pH of the slurry composition to the range defined above. The pH-adjusting agent can include an inorganic acid selected from nitric acid, phosphoric acid, sulfuric acid and hydrochloric acid, or an organic carboxylic acid having a pKa of 6 or less, as well as combination thereof.

The present invention also provides a method for polishing a phase-change memory device using the CMP slurry composition.

In exemplary embodiments of the present invention, the phase-change memory device can be fabricated by applying an insulating material to a semiconductor wafer to form an insulating layer, planarizing the insulating layer, patterning the planar insulating layer, and applying a phase-change material to the patterned insulating layer to form a phase-change material layer; and the CMP slurry composition can be brought into contact with the phase-change material layer to polish the phase-change material layer until the insulating layer is exposed.

In exemplary embodiments of the present invention, the phase-change material layer can be polished by applying the CMP slurry composition to a rotating polishing pad and bringing the polishing pad into contact with the phase-change material layer under predetermined pressure conditions to polish portions of the phase-change material layer by a frictional force. The pressure conditions can include those that are generally permissible in CMP applications.

The present invention also provides a phase-change memory device polished by the polishing method.

(Te) (2:2:5), is used. The phase-change material is deposited on the blanket wafer by D.C magnetron sputtering to form a 2,000 Å-thick layer. A 15,000 Å-thick PETEOS silicon oxide film is used as a polish stop layer, and an IC1000/SubaIV CMP pad (Rodel Corp.) is used as a polishing pad. The phase-change material layer is polished using a 200 mm MIRRA polisher (manufactured by Applied Materials (AMAT)) at a down pressure of 3.0 psi, a slurry flow rate of 200 mL/min., a table speed of 100 rpm and a spindle speed of 100 rpm for one minute.

TABLE 2

| Example No. | Polishing Characteristics | | | | Wet etch rate (Å/min) on GST |
| --- | --- | --- | --- | --- | --- |
|  | Polishing rate on GST (Å/min) | Polishing rate on SiO$_2$ (Å/min) | Polishing selectivity (GST:SiO$_2$) | Polishing non-uniformity (%) on GST |  |
| Example 1 | 1,230 | 16 | 76.8 | 11 | 5 |
| Example 2 | 1,312 | 15 | 87.5 | 12 | 8 |
| Comparative Example 1 | 20 | 5 | 4 | 20 | 0 |
| Comparative Example 2 | 510 | 8 | 63.7 | 34 | 60 |
| Comparative Example 3 | 590 | 9 | 65.6 | 39 | 85 |
| Comparative Example 4 | 910 | 12 | 75.8 | 18 | 100 |

Hereinafter, the present invention will be explained in more detail with reference to the following examples. However, these examples are given for the purpose of illustration only and are not to be construed as limiting the scope of the invention. Further, the following examples are provided to illustrate exemplary CMP methods for planarizing a phase-change material.

EXAMPLES

[Evaluation of Polishing of Blanket Wafers]

Examples 1-2 and Comparative Examples 1-4

Slurries having the compositions indicated in Table 1 are prepared using deionized water containing no abrasive particles. The kind and content of oxidizing agents used are varied in the slurry compositions. Nitric acid is used to adjust the final pH of all slurry compositions to 3.5.

TABLE 1

| Example No. | Kind of oxidizing agent | Content of oxidizing agent (%) | pH |
| --- | --- | --- | --- |
| Example 1 | Propylenediamine tetraacetic acid-Fe | 0.2 | 3.5 |
| Example 2 | FeCl$_3$ | 0.2 | 3.5 |
| Comparative Example 1 | — | 0 | 3.5 |
| Comparative Example 2 | H$_2$O$_2$ | 0.5 | 3.5 |
| Comparative Example 3 | H$_2$O$_2$ | 1.0 | 3.5 |
| Comparative Example 4 | Ammonium persulfate | 1.0 | 3.5 |

After each of the slurry compositions is used to polish a blanket wafer deposited with a phase-change material under the following polishing conditions, the polishing performance of the slurry composition on the phase-change material is evaluated. The results are shown in Table 2.

As the phase-change material, Ge$_2$Sb$_2$Te$_5$ (GST), whose composition is germanium (Ge): antimony (Sb): tellurium As can be seen from Table 2, the slurry compositions of Examples 1 and 2 using a small amount of the corresponding iron compound as an oxidizing agent show high polishing rates on the GST layer and greatly increased selectivities in polishing rate between the GST layer and the silicon oxide film in comparison with the slurry compositions of Comparative Examples 1 to 4. In addition, the slurry compositions of Examples 1 and 2 show lower polishing non-uniformities on the GST layer than the slurry compositions of Comparative Examples 1 to 4. Furthermore, the compositions of Examples 1 and 2 show much lower wet etch rates (WER) on the GST layer than those of Comparative Examples 2 to 4. The composition of Comparative Example 1 comprising no oxidizing agent could not polish the GST layer.

Moreover, since no abrasive particles are included in the slurry compositions of Examples 1 and 2, it is anticipated that the problem of surface contamination caused by abrasive particles can be largely avoid.

The polishing non-uniformity is calculated by the following equation:

Non-uniformity (%)=(Standard deviation of polishing rate/Average of polishing rate)×100(%)

The polishing rate is measured over the entire surface from the center of the wafer using a 49-point polar map method. A lower value of the non-uniformity means that the polishing is more uniformly conducted.

The GST specimens (3 cm×3 cm) are allowed to stand in the respective polishing compositions at room temperature (25° C.) for 20 minutes, followed by etching. Thereafter, the wet etch rate (WER) is calculated by the following equation:

WET (Å/min.)=(Thickness of GST layer before etching−Thickness of GST layer after etching)/20

[Evaluation of Polishing on Patterned Wafers]

To actually evaluate the polishing performance of the slurry compositions on semiconductor patterns, patterned wafers are constructed by the following procedure:

Step 1: Deposition of silicon nitride (SiN) to a thickness of 850 Å

Step 2: Deposition of silicon dioxide ($SiO_2$) to a thickness of 1,500 Å

Step 3: Formation of pattern on the oxide film

Step 4: Deposition of phase-change material ($Ge_2Sb_2Te_5$) to a thickness of 2,000 Å

The silicon oxide film is used as a stop layer in the pattern region. The polishing performance of the compositions of Examples 1 and 2 and Comparative Examples 2 to 4 on the patterned wafers is evaluated.

Evaluation is conducted on the patterned wafers under the same polishing conditions as described in Example 1 except that the polishing time is varied. After over polishing (50%) is performed following the optic end point detection (EPD) time measured using an EPD system, the pattern regions are observed for erosion, dishing and roughness. The results are shown in Table 3.

TABLE 3

| Example No. | Erosion (Å) | Edge over Erosion (EOE, Å) | Dishing (Å) | Residues | Maximum Roughness ($R_{max}$, Å) |
|---|---|---|---|---|---|
| Example 1 | 200 | 46 | 80 | Not observed | 90 |
| Example 2 | 200 | 50 | 82 | Not observed | 100 |
| Comparative Example 2 | 300 | 250 | 180 | Observed | 210 |
| Comparative Example 3 | 400 | 250 | 190 | Observed | 200 |
| Comparative Example 4 | 350 | 200 | 160 | Observed | 180 |

Table 3 demonstrates that the slurry compositions of Examples 1 and 2 comprising an iron compound show much better results in terms of erosion, EOE, dishing, residue and maximum roughness evaluations than those of Comparative Examples 2 to 4.

As apparent from the above description, the present invention provides a CMP slurry composition for polishing a phase-change memory device and a method for polishing a phase-change memory device using the CMP slurry composition. The slurry composition of the present invention can polish a phase-change memory device at a high rate, can achieve high polishing selectivity between a phase-change memory material and a polish stop layer (e.g., a silicon oxide film), and can lower the wet etch rate (WER) on a phase-change memory material to minimize the occurrence of processing imperfections (e.g., dishing and erosion), thereby providing a high-quality polished surface.

Many modifications and other embodiments of the invention will come to mind to one skilled in the art to which this invention pertains having the benefit of the teachings presented in the foregoing descriptions. Therefore, it is to be understood that the invention is not to be limited to the specific embodiments disclosed and that modifications and other embodiments are intended to be included within the scope of the appended claims. Although specific terms are employed herein, they are used in a generic and descriptive sense only and not for purposes of limitation, the scope of the invention being defined in the claims.

What is claimed is:

1. A method for polishing a phase-change memory device comprising a phase change layer, wherein the method comprises contacting said phase-change material layer in the absence of abrasive particles with a CMP slurry composition comprising deionized water and iron or an iron compound, wherein the iron or iron compound is present in an amount of about 0.01 to about 10% by weight, based on the total weight of the slurry composition.

2. The method according to claim 1, wherein the phase-change memory device is fabricated by applying an insulating material to a semiconductor wafer to form an insulating layer, planarizing the insulating layer, patterning the planar insulating layer, and applying a phase-change material to the patterned insulating layer to form a phase-change material layer; and the CMP slurry composition is brought into contact with the phase-change material layer to polish the phase-change material layer until the insulating layer is exposed.

3. The method according to claim 2, wherein the phase-change material layer is polished by applying the CMP slurry composition to a rotating polishing pad and bringing the polishing pad into contact with the phase-change material layer under predetermined pressure conditions to polish portions of the phase-change material layer by a frictional force.

4. The method according to claim 1, wherein the phase-change memory device comprises a metal alloy or a chalcogenide.

5. The method according to claim 4, wherein the phase-change memory device comprises at least one compound selected from InSe, Sb2Te3, GeTe, Ge2Sb2Te5, InSbTe, GaSeTe, SnSb2Te4, InSbGe, AgInSbTe, (GeSn)SbTe, GeSb(SeTe) or Te81Ge15Sb2S2.

6. The method according to claim 1, wherein the iron or iron compound comprises metal iron or a compound containing iron in its molecular structure.

7. The method according to claim 1, wherein the iron or iron compound comprises an ionic iron compound or an iron chelate compound.

8. The method according to claim 1, wherein the slurry composition has a pH of about 2 to about 10.

9. The method according to claim 1, further comprising a pH-adjusting agent.

10. The method according to claim 9, wherein the pH-adjusting agent comprises at least one acid selected from nitric acid, phosphoric acid, sulfuric acid, hydrochloric acid, organic carboxylic acids having a pKa of 6 or less, or a combination thereof.

11. The method according to claim 1, wherein the iron or iron compound uniformly polishes the phase change memory device to a GexSbyTez (GST) unevenness of less than 18% and a polishing roughness less than 100 Å.

12. The method according to claim 11, wherein the iron or iron compound uniformly polishes the phase change memory device to a GST unevenness of 12% or less.

13. The method according to claim 1, wherein the iron or iron compound is an iron chelate compound.

14. The method according to claim 1, wherein the iron or iron compound comprises propylenediamine tetraacetic.

15. The method according to claim 1, wherein the iron or iron compound comprises FeC13.

16. The method according to claim 1, wherein the iron or iron compound is a GST oxidizing agent.

* * * * *